US008484836B2

(12) United States Patent
Lanzara et al.

(10) Patent No.: US 8,484,836 B2
(45) Date of Patent: Jul. 16, 2013

(54) FLEXIBLE NETWORK

(75) Inventors: Giulia Lanzara, Palo Alto, CA (US);
Fu-Kuo Chang, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 1139 days.

(21) Appl. No.: 12/208,139

(22) Filed: Sep. 10, 2008

(65) Prior Publication Data
US 2009/0067144 A1    Mar. 12, 2009

Related U.S. Application Data

(60) Provisional application No. 60/971,188, filed on Sep. 10, 2007.

(51) Int. Cl.
*H05K 3/36*    (2006.01)
*H05K 3/40*    (2006.01)
*H01R 9/00*    (2006.01)

(52) U.S. Cl.
USPC .............. 29/831; 29/832; 29/846; 174/253; 361/299.2; 349/68

(58) Field of Classification Search
USPC ............ 29/825, 827, 832, 831, 821, 852, 29/826, 847; 361/299.2, 299.4, 659.54; 439/32, 439/33, 776, 69, 86, 67; 324/390, 754, 765, 324/158 P
See application file for complete search history.

(56) References Cited

U.S. PATENT DOCUMENTS

| 5,898,312 | A * | 4/1999 | Uhling et al. ............ 324/754.07 |
| 6,556,321 | B1 * | 4/2003 | Milton et al. .................... 398/79 |
| 6,743,982 | B2 * | 6/2004 | Biegelsen et al. ............... 174/69 |
| 2004/0192082 | A1 * | 9/2004 | Wagner et al. .................. 439/67 |
| 2006/0286785 | A1 | 12/2006 | Rogers et al. |
| 2009/0067144 | A1 * | 3/2009 | Lanzara et al. ............... 361/776 |

OTHER PUBLICATIONS

Li et al. *Compliant thin film patterns of stiff materials as platforms for stretchable electronics*, J. Mater. Res., vol. 20, No. 12, Dec. 2005, pp. 3274-3277.
D.Y. Khang, H. Jiang, Y. Huang, and J. Rogers, "*A Stretchable Form of Single-Crystal Silicon for High-Performance Electronics on Rubber Substrates*," Science Magazine, vol. 311, Jan. 13, 2006, pp. 208-212.
K. Huang and P. Peumans, "*Stretchable silicon sensor networks for structural health monitoring*," Smart Structures and Materials 2006: Sensors and Smart Structures Technologies for Civil, Mechanical,and Aerospace Systems, Proc. of SPIE, vol. 6174, 617412, pp. 1-10.

* cited by examiner

*Primary Examiner* — Peter DungBa Vo
*Assistant Examiner* — Kaying Kue

(57) ABSTRACT

An integrated circuit connector is extendable for a variety of applications. In connection with various embodiments, an electrical connector has first and second ends connected to respective circuit nodes in an integrated circuit device. The connector is bundled between the circuit nodes (e.g., substantially all of the connector is located between nodes), and is extended from such a bundled state in which the first and second connected ends are separated by a first proximate distance. The connector is applied in an extended state in which the first and second connected ends are separated by a second distance that is greater than the first proximate distance by at least two orders of magnitude.

10 Claims, 4 Drawing Sheets

FLEXIBLE NETWORK

RELATED PATENT DOCUMENTS

The present invention claims the benefit, under 35 U.S.C. §119(e), of U.S. Provisional Patent Application Ser. No. 60/971,188, entitled "Flexible Network" and filed on Sep. 10, 2007, which is fully incorporated herein by reference.

FEDERALLY-SPONSORED RESEARCH OR DEVELOPMENT

This invention was made with Government support under contracts FA9550-07-1-0350 & FA9550-04-1-0150 awarded by the Air Force Office of Scientific Research. The Government has certain rights in this invention.

FIELD OF THE INVENTION

The present invention relates to flexible conductive and non-conductive networks, circuit devices, and the manufacture and use of the same.

BACKGROUND

For wired and wireless electrical networks, circuit components such as nodes, interconnects (where applicable) and individual devices are often desirably located in one or more certain spatial arrangements that suit particular applications. For instance, it is often desirable to place sensor circuits at select locations to facilitate the detection of conditions at the select locations.

Many network applications are also susceptible to damage or other undesirable effects that relate to the relative inflexibility of network components. For instance, conductive network connections (e.g., interconnects) that make electrical connections tend to be very inflexible and susceptible to damage when exposed to vibration or other harmful environmental conditions. Such damage can render circuits and networks inoperable.

These and other characteristics have continued to present challenges to circuit applications.

SUMMARY

The present invention is directed to overcoming the above-mentioned challenges and others related to a variety of applications including those discussed above. These and other aspects of the present invention are exemplified in a number of illustrated implementations and applications, some of which are shown in the figures, described herein, and characterized in the claims section that follows.

In connection with various example embodiments of the present invention, an extendable network includes connectors that connect nodes, with the nodes being of the same material as the connectors or of another material that is different than the material of the connectors. Each connector connects at least 2 nodes, with size of the network being set to suit certain applications (e.g., there is no limit on the number of nodes that can be interconnected and the number of connectors that are connected to each node). Where a plurality of nodes are connected, perimeter nodes may be directly connected to the external world. After extension, the network can be used for a variety of purposes, such as by integration in a material or bonding in or into a structure.

The nodes are implemented in a variety of fashions, relative to the connectors and otherwise. In some applications, the nodes form part of the network and, in other applications, the nodes are not part of the network. For various applications, the nodes are functionalized using one or more various fabrication approaches and related designs. In many embodiments, the nodes are circuit nodes that include one or more of microchips, microprocessors, MEMS, NEMS, sensors, actuators, or other devices.

The extendable network can be implemented for a variety of uses. In some embodiments, the network includes an array of wired and/or wireless nodes, with the nodes selectively integrated with devices such as sensors, actuators, switches, hardware, and software. In other embodiments, the network is implemented to mechanically place objects (e.g., micro-scale objects) in selected locations, with the network either left in place after placement of the objects, or removed (e.g., dissolved) to leave the objects behind.

The connectors are manufactured or otherwise implemented in a variety of manners. In some applications, the connectors are folded or rolled outside of nodes in a first state (e.g., a bundled state), and unfolded or unrolled in a second state (e.g., an extended state). The degree of unfolding or unrolling is highly flexible, depending upon the application; in various embodiments, the connectors can be extended to distances that are one, two or several magnitudes greater than a distance across the connectors in a folded or rolled state (i.e., between ends of the connectors in such a first state).

In various implementations, the connectors are extended mainly for an unfolding (or unrolling) effect while enduring insubstantial strain or no strain. In an extended state or, in certain applications, during an extension, the connectors are subjected to strain and/or stretching.

The connectors include one or more of a multitude of materials. In some applications, the connectors are formed using a conductive material and are thus conductive. In other applications, the connectors are metallized with a metal layer to make the connectors conductive. When conductive, the connectors are selectively insulated for certain applications, such as by polymerization or by making a sandwich of thin film layers (e.g., by bonding cured polymer layers or moulding of uncured polymers). Materials used to form the connectors may also include a pre-existing material such as a thin film, a material that is originally in fluid form, or a photosensitive material.

In still other applications, the connectors are non conductive; this approach is useful when the network is used for wireless applications or to pick and place micro-scale nodes in specific locations at the micro-scale or macro-scale.

In some embodiments, the nodes are interconnected with a reinforcing element or elements that break during an unfolding or extending process. The reinforcing elements mitigate excessive out-of-plane deformations prior to, or during, unfolding or extending.

The connectors (and nodes, where appropriate), are manufactured using one or more of a variety of approaches. In some applications, the network is fabricated by shaping a monolithic material (e.g., polymer thin films, polyimides and photosensitive materials) and implementing the shaped material. In other applications, the network is formed by moulding a material starting, for example, from the material's uncured phase (e.g., as with polymers). In either application, the network may be or may not be integrated with nodes (functionalized or otherwise) at its manufacturing stage.

When functionalized nodes (e.g., one or more of circuits, microchips, microprocessors, MEMS, NEMS, sensors, actuators, or other devices) are used, the functionalized nodes are formed in one or more of a variety of manners. In some embodiments, functionalized nodes are formed directly onto nodes of the network using approaches such as those used to form thin-film transistors (TFTs) with polymer connectors. In other embodiments, functionalized nodes are formed onto Silicon nodes or a mix of polymer and silicon connectors.

Functional nodes can also be built and functionalized separately from the connectors and then joined to the connectors, or built onto nodes connected by the connectors. Joining can be obtained by bonding a prefabricated network with prefabricated functional nodes, or fabricating the network (connectors) around pre-fabricated functional nodes in a way to include the nodes as part of the network. The latter approach of fabricating the network around nodes may involve, for example, forming functional nodes from Silicon and integrating the functional nodes in the network by embedding them into a polymer material that is later shaped to form the connectors between the nodes.

In another embodiment, the network is extended with functional nodes or circuits embedded in the extended network. This approach may be facilitated, for example, by bonding the network to a sacrificial layer that is later removed to leave the network in place.

According to another example embodiment of the present invention, an extendable connector flexibly connects two or more nodes as described herein and maintains the connection upon (subsequent) significant separation of the nodes. In some applications, the extendable connector is bundled, folded or rolled in a manner that facilitates the manufacture of the nodes and subsequent extension of the connector from a first state of separation of the nodes, to a second state of separation of the nodes that is one or more orders of magnitude greater than the first state of separation.

According to another example embodiment of the present invention, an electrical circuit is manufactured by extending and applying a connector, which has first and second connected ends, in an extended state to place and/or connect circuit components at the connected ends. For instance, the connector can be extended from a bundled state in which the first and second connected ends are separated by a first proximate distance, and applied in an extended state in which the first and second connected ends are separated by a distance that is significantly greater than the first proximate distance. In some applications, the connector is an electrical connector that electrically connects circuit nodes in both the bundled and extended states, facilitating the extension of the circuit nodes to distances of one, two or more orders of magnitude while maintaining electrical connectivity.

Many embodiments are directed to the manufacture of a multitude of connectors, as described above, in an interconnected network arrangement, and the coupling of a plurality of circuit nodes at ends thereof, with certain nodes coupled to ends of two or more connectors. The network arrangement is extended to facilitate the separation of the nodes to one, two or more orders of magnitude of separation, relative to a bundled state of the connectors.

In connection with another example embodiment, an electrical circuit arrangement includes an extendable connector that extends, from a bundled state in which first and second connected ends of the connector are separated by a first proximate distance, to an extended state in which the first and second connected ends are separated by a second distance that is greater than the first proximate distance by at least two orders of magnitude. The connector facilitates the extension of circuit nodes or other components at the ends of the connector while maintaining connection between the nodes for placement and/or electrical connectivity. Many embodiments are directed to the implementation of a multitude of such connectors in an interconnected network arrangement, the connectors coupling a plurality of circuit nodes at ends thereof, with certain nodes coupled to ends of two or more connectors.

The above summary is not intended to describe each illustrated embodiment or every implementation of the present invention.

BRIEF DESCRIPTION OF THE FIGURES

The invention may be more completely understood in consideration of the detailed description of various embodiments of the invention that follows in connection with the accompanying drawings, in which.

Figure 1:
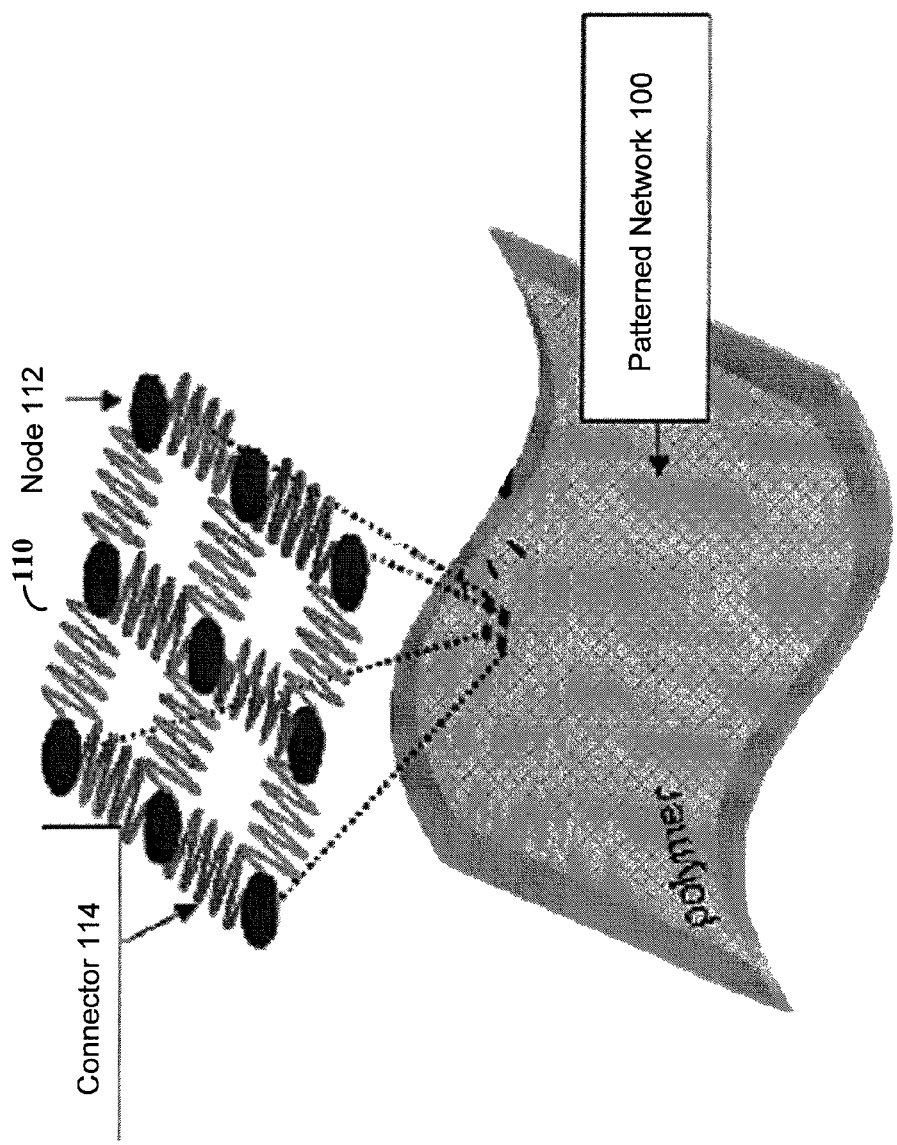
FIG. 1 shows an interconnect network, according to an example embodiment of the present invention.

While the invention is amenable to various modifications and alternative forms, examples thereof have been shown by way of example in the drawings and will be described in detail. It should be understood, however, that the intention is not to limit the invention to the particular embodiments shown and/or described. On the contrary, the intention is to cover all modifications, equivalents, and alternatives falling within the spirit and scope of the invention.

DESCRIPTION

The present invention is believed to be applicable to a variety of different types of circuits, processes and applications benefiting from interconnected conductors and conductor networks, as well as non-conductive interconnect networks. While the present invention is not necessarily limited to such applications, various aspects of the invention may be appreciated through a discussion of examples using this context.

In connection with various example embodiments of the present invention, a stretchable network of interconnected circuit nodes includes extendable metal interconnects that extend to facilitate increased physical separation of the interconnected circuit nodes. In some applications, this approach is implemented to realize large area, flexible networks having a high density array of wired or wireless independent microcomputers placed in multifunctional nodes. These approaches facilitate structural integration and thin films with a high density array of self functioning, multifunctional nodes.

In connection with various embodiments, and as consistent with the above discussion, the term "circuit nodes" herein may refer to one or more of a variety of types of nodes, may involve a multifunctional node, and may be implemented in a variety of manners. A circuit node may include one or more of microchips, microprocessors, MEMS, NEMS, sensors, actuators, or other devices. For instance, in some applications, the circuit node is a sensor circuit that senses characteristics of a material to which the circuit node is applied, and that provides a signal, via extendable metal interconnects that connect the circuit node, for providing an indication of the sensed characteristics.

In some applications, the network is used as a carrier structure to mount wireless multifunctional nodes on, or into a structure or a device. Such applications can be implemented, for example, by leaving a polymer network in situ or removed by peeling it off from wireless nodes.

In one example embodiment, microwires are formed in a bundled (e.g., folded or rolled) manner between interconnected nodes. The microwires are formed on or with a variety of materials, such as flexible materials, depending upon the application and available material, and extended to bring the network from a microscale to a macroscale. One application is directed to an extendable microwire network having metal formed on or otherwise with a polymide film, which is flexible and capable of sustaining high temperature variations. A biocompatible Silicone-based organic polymer network material such as PDMS (Polydimethylsiloxane) is used in other applications.

In many implementations, a connector such as described above is formed in a bundled arrangement lying between two circuit nodes that the connector electrically (or otherwise) connects. Ends of the connector are respectively connected to the circuit nodes, with substantially all (e.g., 70%, 80%, 90% or more) of the connector being located between the two nodes. In some embodiments, substantially all of a connector extends between two nodes such that neither portion of either node is located between the connector and the other node (e.g., the connector does not extend around either node, such as shown in FIG. 1 and discussed below). In still other embodiments, a connector that connects two nodes has a portion thereof located such that one of the nodes is between the portion of the connector and the other of the nodes (e.g., the connector has one or two windings around a node), with at least about 90% of the connector being bundled between the nodes.

Turning now to the Figures, FIG. 1 shows an extendable interconnect network 100, according to another example embodiment of the present invention. The network 100 includes a plurality of nodes that are connected by extendable interconnects, as represented in a view of network 110 (a portion of the network 100). Network 110 includes an arrangement of multifunctional nodes coupled by connectors in a bundled or folded state, with node 112 and connector 114 labeled by way of example.

The connectors (114) include one or more of a multitude of materials arranged in different manners to connect to the nodes (112). For example, the connectors may include conductive material, non-conductive material or a combination of both conductive and non-conductive materials. Conductive connectors are formed in a variety of manners, such as by metallizing material onto a polymer or other material or using a flexible material that is either conductive itself or made conductive using some sort of treatment. Non-conductive connectors are also formed in a variety of manners using one or more non-conductive flexible materials. In these contexts, materials used for conductive or non-conductive connectors may include those described in the above-referenced provisional patent application, to which benefit is claimed.

Figure 2:
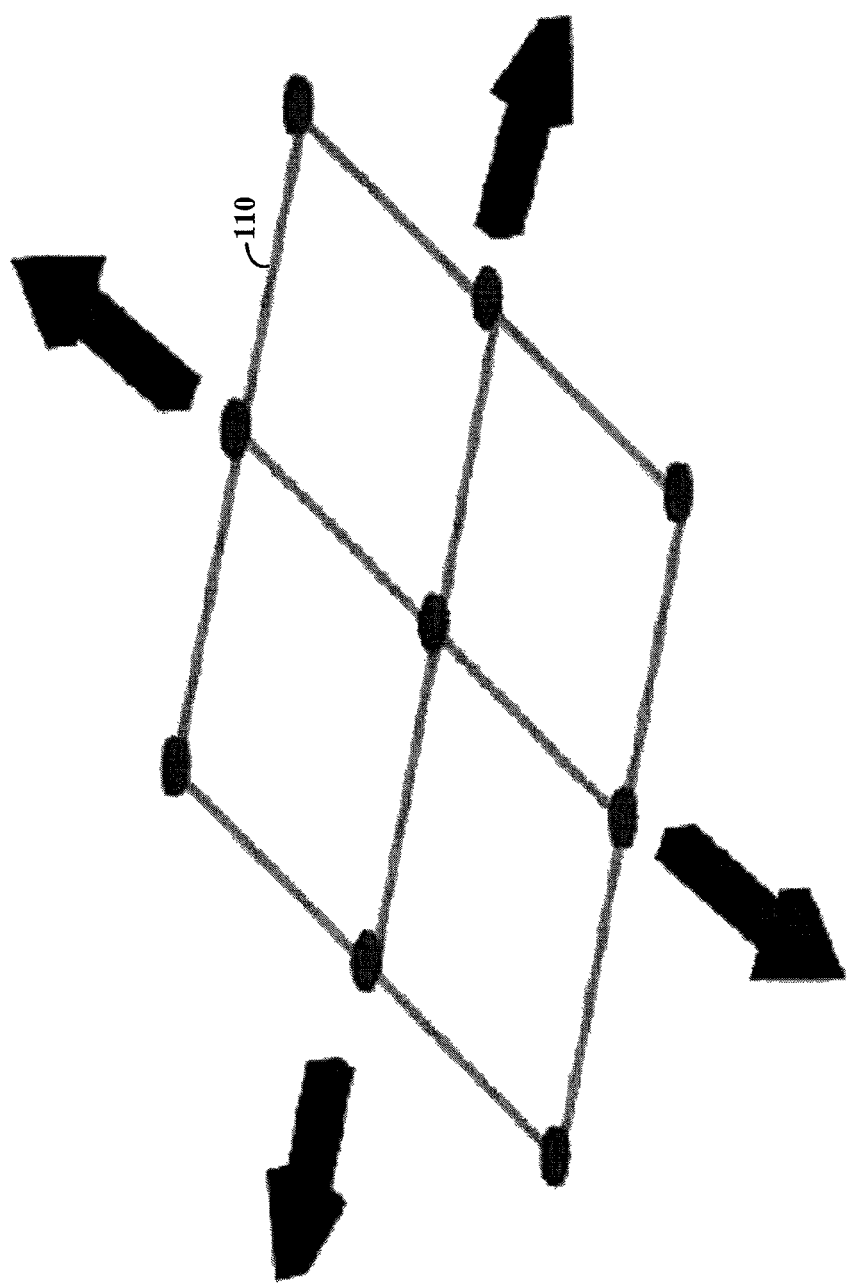
FIG. 2 shows a portion of the interconnect network in FIG. 1 in an extended state, according to another example embodiment of the present invention.

FIG. 2 shows the interconnect network 110 of FIG. 1 in an extended state, according to another example embodiment of the present invention. The connectors (e.g., 114 in FIG. 1) have been extended as the nodes (e.g., 112 in FIG. 1) have been separated. This approach facilitates coupling of the extended interconnect network 110 to a multitude of structures.

Figure 3:
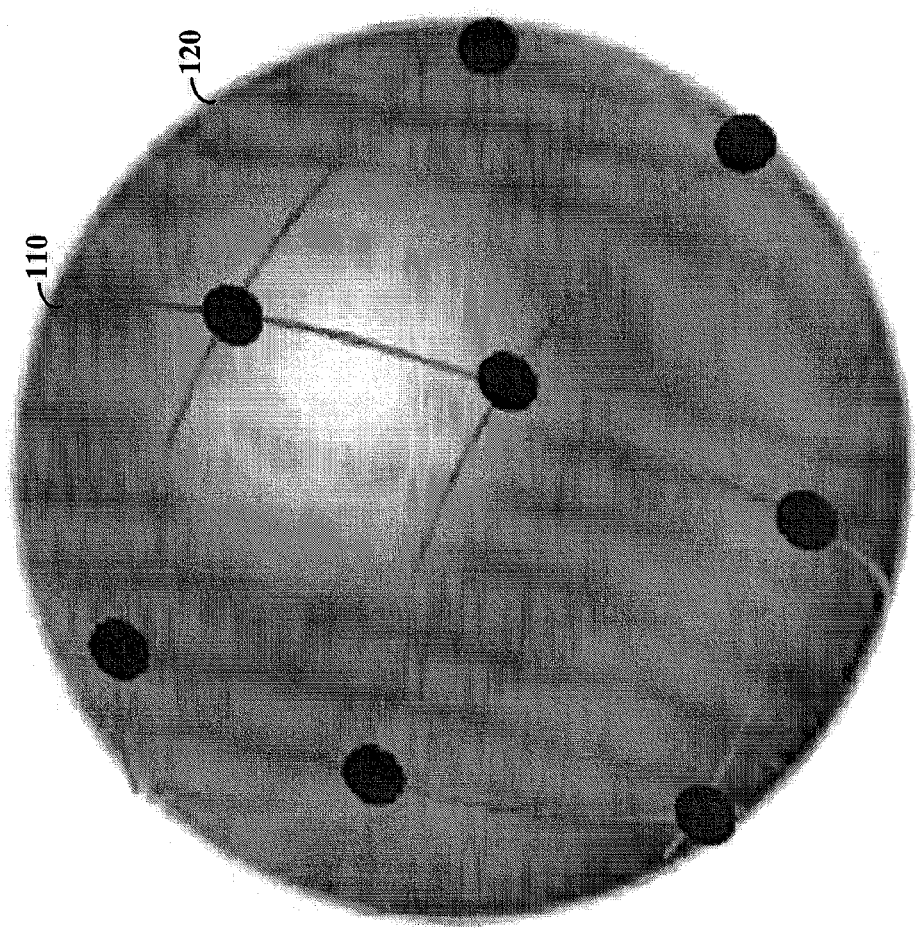
FIG. 3 shows the extended interconnect network of FIG. 2 applied to a structure, according to another example embodiment of the present invention.

In such a context, FIG. 3 shows the extended interconnect network 110 shown in FIG. 2 applied to a particular structure 120, in connection with another example embodiment of the present invention. The extended interconnect network 110 is thus used to cover a relatively large macroscopic area of any shape, while maintaining connectivity between the nodes on the network. While FIG. 3 shows a relatively few number of nodes applied to a generally spherical structure 120, the network 100 (or 110) is applicable to use with a multitude of nodes and to a variety of different shapes, depending upon the application. Further applications are directed to the embedding or layering of the interconnect network in two or more layers. A variety of such applications are described in the above-referenced provisional patent application.

In many applications, the network 110 (or 100) is used to place the nodes (112) into a set position after extension of the network as shown, for example, in FIG. 2 and in FIG. 3, and the network is subsequently removed. For instance, where used to set wireless network devices at each node, the network 110 can be used to place the wireless devices at desired locations and subsequently removed after placement.

In one embodiment, the network arrangement shown in FIG. 1 includes connectors (114) that include an ultra-thin layer of folded polymer-based microwires. The microwires are formed by coating a polymer layer with a metal layer that gives conductivity to the polymer wires, and functional nodes (112) are integrated in the network of microwires. The functional nodes may be built-in or integrated in the network as described, for example, in the above-referenced provisional patent application. This basic element is repeated in two or multiple directions to generate a two-dimensional network of a relatively high density array of thousands or millions of high performance multifunctional micronodes that can be surface bonded or embedded to/into structures or materials with different shapes, forms and stiffness (from flexible to rigid), such as the example shown in FIG. 3 and other examples in the above-referenced provisional patent application. With this arrangement, each node is connected to other neighboring nodes via microwires, with each interior node in the network 100 connected to four other nodes. Certain nodes can be connected to contact pads that have macroscopic dimensions, with the contact pads connected through micro-beams to a macroscopic frame. The micro-beams and the frames can be cut prior to an extending process (as represented, e.g., in FIG. 2) to position the nodes for implementation. Where implemented with a polymer sheet, multiple networks can be simultaneously built and then cut from the polymer sheet.

Connectors and networks are fabricated in accordance with a variety of embodiments. In some embodiments, a network is etched in a pre-existing polymer film and functional nodes are built in the network. In other embodiments, the network is etched in a pre-existing polymer film and bonded to functional nodes. Other embodiments are directed to using a mold to shape a polymer (fluid in origin) to form a network, and the network is either bonded to functional nodes or the functional nodes are built therein. Still other embodiments are directed to building functional nodes first, and then building a polymer network around them. As described above, such connectors may be formed using a photosensitive polymer (such as a polyimide).

Figure 4:
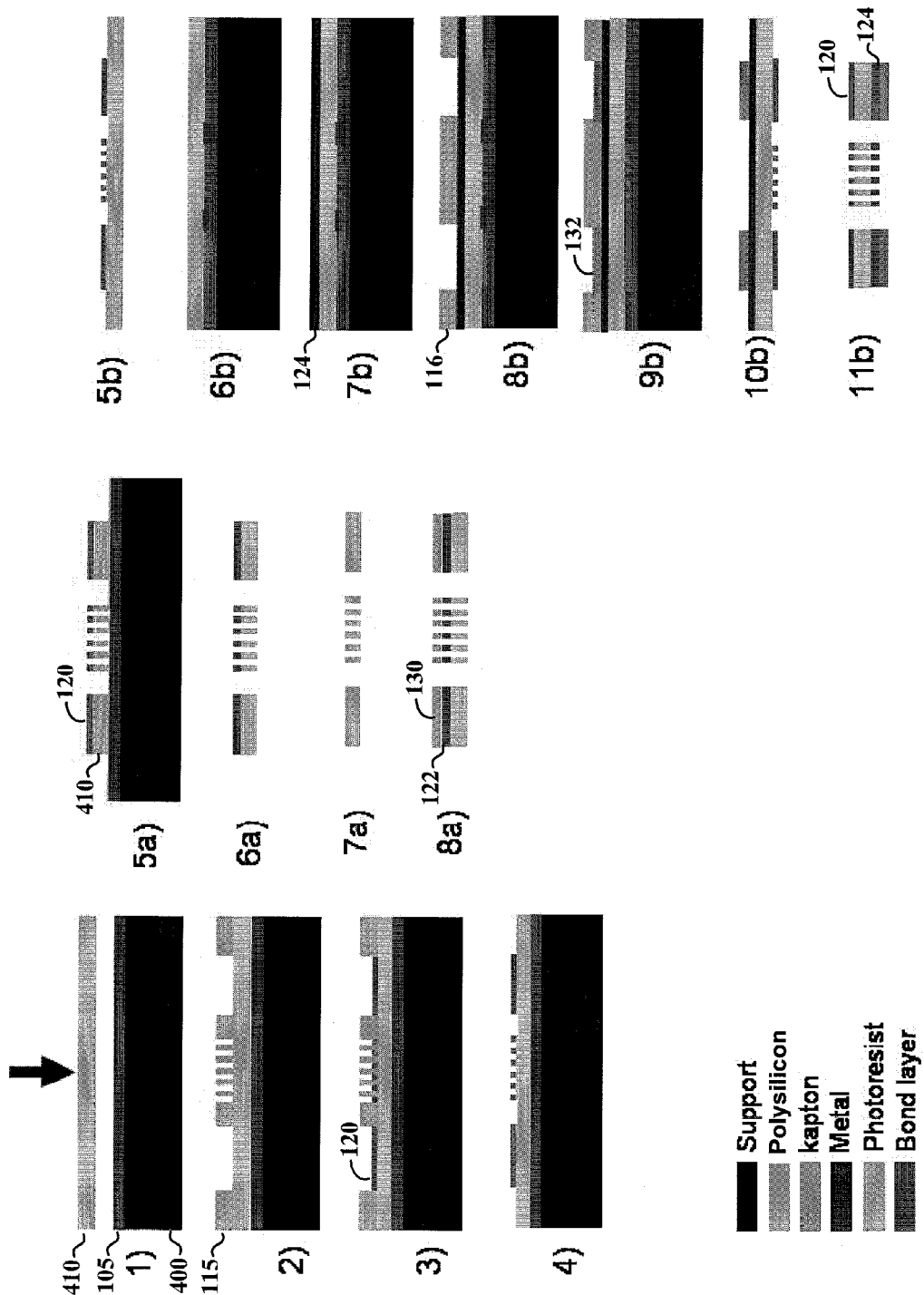
FIG. 4 shows example approaches to manufacturing a polymer network, according to other example embodiments of the present invention.

FIG. 4 shows example approaches to manufacturing a polymer network (connectors), in accordance with the above and otherwise, according to other example embodiments of the present invention. Steps labeled 1-4 are first performed, and one set of either set of steps 5a-8a (referred to herein as process 1) or steps 5b-11b (referred to herein as process 2) are subsequently performed. Referring to step 1, a rigid support 400 (e.g., Si wafer or others) is coated with a thin bond layer 105 and bonded with a polymer film 410. At step 2, the film is then coated with a photoresist layer 115, exposed and developed in order to open the areas were the nodes and springs are desired. A thin metal layer 120 is then deposited to create a mask at step 3, and the photoresist 115 is removed.

In process 1, and referring to step 5*a*, the polymer film 410 is etched into the shape of the mask 120. At step 6*a*, the etched polymer and metal layer 120 are un-bonded from the support 400 and bond layer 105. Optionally, the etching at step 5*a* also involves etching of the metal layer 120, with the result shown at step 7*a* (after un-bonding). At step 8*a*, a polysilicon layer 130 has been formed on metal layer 122. In applications involving step 6*a*, the metal layer 122 is the same as the metal layer 120. In applications involving step 7*a*, the metal layer 122 is deposited after removal of the metal layer 120. One or more of these steps may be carried out with a wash step in-between. In addition, a mask is optionally deposited on one or more functional nodes in a circuit being so formed, for protecting the functional node(s). Conductive layers for forming electrical connections can be formed under the functional node(s) in such instances.

In process 2, after step 4, a mask is formed on one side of the connector and a metal film and a functional node are formed on an opposite side of the connector (with a plurality of such nodes and connectors contemplated for network implementations). At step 5*b*, the polymer film 410 is released from the rigid block 400 and bonded again to it on the mask side as shown at step 6*b* (i.e., the film and mask are flipped). A protected metal layer 124 is deposited on the polymer layer at step 7*b*. The metal layer 124 is masked and patterned (e.g., with a standard photolithography process) at step 8*b* to form a photoresist layer 116. At step 9*b*, polysilicon 132 is formed in the patterned openings. At step 10*b*, the photoresist 116 has been lifted off and the support 400 has been un-bonded. At step 11*b*, shown flipped again relative to step 10*b*, the polymer film is etched on the side of the mask to etch the metal 120 and polymer 410. The metal 124 is patterned during the etching process through the metal mask 120, and the mask 120 can be optionally etched during the etching process.

In some embodiments, the steps relating to bonding of the connector to a rigid block are not carried out when polymer films that are used are resistant to temperature variations (in terms of expansions and contractions), or when the thermal properties of the films used are similar to the properties of the mask.

In other embodiments, fracture generation at sharp edges is mitigated by depositing a uniform metal layer on the back of the network (e.g., as with process 2 in FIG. 4), and the etching is effected on the opposite side as described.

According to another example embodiment, a network is manufactured to include a connector that has first and second connected ends and that cannot be stretched beyond a first distance. The connector is extended to an extended state in which the first and second connected ends are separated to a distance that is greater than the first distance. In this context, the first distance refers to one or more distances relative to the ability of the connector to stretch, such as an elastic stretching limit, an expanded distance beyond which the connector deforms or changes properties, or a distance beyond which the connector breaks when stretched. For instance, by bundling or rolling the connector in a first state, the ends of the connector can be extended in a second state to a separation distance that is large relative to the ability of the connector to stretch (e.g., were the connector first extended to its full length, then stretched). This approach may be implemented, for example, with a connector as shown in FIG. 1 (e.g., connector 114).

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such modifications and changes do not depart from the true spirit and scope of the present invention.

What is claimed is:

1. A method of manufacturing an integrated electrical circuit using an electrical connector that has first and second ends connected to respective circuit nodes, the method comprising:

extending the electrical connector from a bundled state in which the first and second connected ends are separated by a first proximate distance, and in which substantially all of the connector is bundled between the circuit nodes; and applying the electrical connector in an extended state in which the first and second connected ends are separated by a second distance that is greater than the first proximate distance by at least two orders of magnitude;

prior to the step of extending the electrical connector, manufacturing the electrical connector over a monolithic substrate to electrically connect, via the first and second connected ends, circuit nodes formed on the monolithic substrate.

2. A method of manufacturing an integrated electrical circuit using an electrical connector that has first and second ends connected to respective circuit nodes, the method comprising:

extending the electrical connector from a bundled state in which the first and second connected ends are separated by a first proximate distance, and in which substantially all of the connector is bundled between the circuit nodes; and applying the electrical connector in an extended state in which the first and second connected ends are separated by a second distance that is greater than the first proximate distance by at least two orders of magnitude, wherein the step of applying includes bonding the electrical connector and circuits coupled to the connected ends to a substrate in the extended state.

3. The method of claim 1, further including forming the electrical connector by metallizing a microwire onto a flexible material.

4. The method of claim 1, further including forming the electrical connector by forming a flexible material that is electrically conductive.

5. A method of manufacturing an integrated electrical circuit using an electrical connector that has first and second ends connected to respective circuit nodes, the method comprising:

extending the electrical connector from a bundled state in which the first and second connected ends are separated by a first proximate distance, and in which substantially all of the connector is bundled between the circuit nodes; and applying the electrical connector in an extended state in which the first and second connected ends are separated by a second distance that is greater than the first proximate distance by at least two orders of magnitude, wherein the step of extending includes extending the electrical connector to set circuits coupled to ends of the connector in selected locations on a structure, and the step of applying includes coupling the connector and the circuits to the structure.

6. The method of claim 1, prior to extending the electrical connector, further including providing circuit nodes, and forming the electrical connector to couple the provided circuit nodes.

7. A method of manufacturing an integrated electrical circuit using an electrical connector that has first and second ends connected to respective circuit nodes, the method comprising:

extending the electrical connector from a bundled state in which the first and second connected ends are separated by a first proximate distance, and in which substantially all of the connector is bundled between the circuit nodes; and applying the electrical connector in an extended state in which the first and second connected ends are separated by a second distance that is greater than the first proximate distance by at least two orders of magnitude, wherein the steps of extending and applying include extending and applying a multitude of electrical connectors that form an interconnected electrical network coupled via nodes at respective ends of each of the electrical connectors, and the step of extending includes using reinforcing structures to support the arrangement of the nodes during extension to mitigate out-of-plane deformation of the nodes.

8. The method of claim 7, wherein using reinforcing structures includes breaking the reinforcing structures while extending the nodes.

9. A method of manufacturing an integrated electrical circuit using an electrical connector that has first and second ends connected to respective circuit nodes, the method comprising:

extending the electrical connector from a bundled state in which the first and second connected ends are separated by a first proximate distance, and in which substantially all of the connector is bundled between the circuit nodes; and applying the electrical connector in an extended state in which the first and second connected ends are separated by a second distance that is greater than the first proximate distance by at least two orders of magnitude, wherein the bundled state is a form in which the electrical connector is rolled and wherein extending the electrical connector includes unrolling the electrical connector.

10. The method of claim 1, wherein the respective circuit nodes are fixed to a substrate, and the step of extending the electrical connector includes maintaining each of the circuit nodes fixed to the substrate in a stationary position, relative to the substrate.

* * * * *